(12) United States Patent
Beller et al.

(10) Patent No.: US 8,049,495 B2
(45) Date of Patent: Nov. 1, 2011

(54) PROBE FOR A MAGNETIC REMANENCE MEASUREMENT METHOD, AND METHOD FOR DETECTING DEPOSITS OF FOREIGN MATERIAL AND INCLUSIONS IN HOLLOW SPACES

(75) Inventors: Thomas Beller, Magdeburg (DE);
Wolf-Dieter Feist, Vierkirchen (DE);
Johann Hinken, Mageduburg (DE);
Christian Ziep, Samswegen (DE)

(73) Assignee: MTU Aero Engines GmbH, Munich (DE)

( * ) Notice: Subject to any disclaimer, the term of this patent is extended or adjusted under 35 U.S.C. 154(b) by 856 days.

(21) Appl. No.: 12/104,851

(22) Filed: Apr. 17, 2008

(65) Prior Publication Data

US 2009/0102471 A1    Apr. 23, 2009

(30) Foreign Application Priority Data

Oct. 19, 2007  (DE) .......................... 10 2007 050 143

(51) Int. Cl.
*G01N 27/72* (2006.01)
*G01R 33/09* (2006.01)

(52) U.S. Cl. ...................................... 324/252; 324/228

(58) Field of Classification Search .................. 324/212, 324/228, 238, 240, 252
See application file for complete search history.

(56) References Cited

U.S. PATENT DOCUMENTS

| | | | |
|---|---|---|---|
| 4,342,016 A * | 7/1982 | Yokoo et al. | 335/79 |
| 5,117,184 A * | 5/1992 | Allison et al. | 324/239 |
| 5,121,058 A | 6/1992 | Allison et al. | |
| 6,407,545 B1 | 6/2002 | Sato et al. | |

FOREIGN PATENT DOCUMENTS

DE    4126810    4/1993

* cited by examiner

*Primary Examiner* — Bot Ledynh
(74) *Attorney, Agent, or Firm* — Greer, Burns & Crain, Ltd.

(57) ABSTRACT

A probe for a magnetic remanence measurement method, in particular for detecting foreign material deposits and inclusions in hollow spaces, the hollow spaces being formed in a non-ferromagnetic material and the foreign material deposits and inclusions being made of a ferromagnetic material, wherein the probe includes at least one magnetic field sensor, at least one first and one second magnet, the magnets being configured before the at least one magnetic field sensor in a direction of introduction into the hollow space, and being situated relative to one another in such a way that their pole axes run non-parallel to one another.

19 Claims, 2 Drawing Sheets

PROBE FOR A MAGNETIC REMANENCE MEASUREMENT METHOD, AND METHOD FOR DETECTING DEPOSITS OF FOREIGN MATERIAL AND INCLUSIONS IN HOLLOW SPACES

BACKGROUND

The present invention relates to a probe for a magnetic remanence measurement method, in particular for detecting deposits of foreign material and inclusions in hollow spaces, the hollow spaces being formed in a non-ferromagnetic material, and the foreign material deposits and inclusions being made of a ferromagnetic material, and the probe having at least one magnetic field sensor. The present invention further relates to a method for detecting foreign material deposits and inclusions in hollow spaces, the hollow spaces being formed in a non-ferromagnetic material, and the foreign material deposits and inclusions being made of a ferromagnetic material.

In a large number of technical applications, significant problems are caused by ferromagnetic inclusions situated in a non-ferromagnetic surrounding environment. Thus, for example, the smallest foreign material deposits or inclusions in components of aircraft engines can cause significant damage to these engines. Corresponding foreign material deposits and inclusions can be, for example, cutting material residue resulting from breakage or chipping of cutting edges of drilling tools. Such inclusions result in defects in the area of the surface of the corresponding components, but these defects are not easily recognizable. These foreign material deposits and inclusions become particularly relevant in the case of drilled holes, because these have an increased level of tension and are also very difficult to access. In order to detect foreign material deposits and inclusions in hollow spaces, in particular in bores in turbines and compressor materials of aircraft engines, destruction-free test methods based on ferromagnetism have been described. These methods are applicable because the materials spalled by the drilling tool are ferromagnetic hard metal, whereas turbine and compressor materials are not ferromagnetic. In particular, the magnetic remanence method, and also the eddy current method, have been described and used for the detection of small ferromagnetic particles in a non-ferromagnetic environment. However, these two methods have various disadvantages when used for the detection, location, and characterization of ferromagnetic inclusions in hollow spaces. Thus, up to now it has been possible to carry out the magnetic remanence method for the detection of foreign material deposits and inclusions only from the surface of the component. On the other hand, hollow space tests using the eddy current method have the disadvantage that it is possible to distinguish ferromagnetic inclusions from geometric anomalies only to a limited extent.

Therefore, the object of the present invention is to provide a probe of the general type described for a magnetic remanence measurement method that enables reliable detection and location of ferromagnetic foreign material deposits and inclusions in hollow spaces.

In addition, the object of the present invention is to provide a method of the general type described for the detection of foreign material deposits and inclusions in hollow spaces that ensures a reliable detection and location of ferromagnetic foreign material deposits and inclusions.

SUMMARY

A probe according to the present invention for a magnetic remanence method, in particular for detecting foreign material deposits and inclusions in hollow spaces, the hollow spaces being formed in a non-ferromagnetic material and the foreign material deposits and inclusions being made of a ferromagnetic material, has at least one magnetic field sensor. In addition, the probe comprises at least one first and one second magnet, the magnets being configured before the at least one magnetic field sensor in a direction of introduction into the hollow space, and being situated relative to one another in such a way that their pole axes run non-parallel to one another. The arrangement of two magnets having pole axes that run differently results in a magnetization of the ferromagnetic foreign material deposits and inclusions in different directions, so that the main orientation of the foreign material particle or of the inclusion can be reliably represented. Advantageously, the probe according to the present invention ensures a reliable detection and location of ferromagnetic foreign material deposits and inclusions in hollow spaces. According to a specific embodiment of the probe according to the present invention, the pole axes of the first and second magnets can be situated perpendicular to one another.

In further advantageous realizations of the probe according to the present invention, the magnetic field sensor and the magnets are situated on a base element. The probe is advantageously configured such that it can be introduced into hollow spaces having a diameter between 2 mm and 100 mm, in particular between 2 mm and 10 mm. The miniaturization of the probe makes it possible to analyze even those hollow spaces having a very small diameter, such as hollow spaces resulting from drilling.

In a further advantageous realization of the probe according to the present invention, this probe has a first and a second magnetic field sensor, the first magnetic field sensor being fashioned for the detection of a magnetic remanence caused by the first magnet, and the second magnetic field sensor being fashioned for the detection of a magnetic remanence caused by the second magnet. The first magnet can be situated between the first magnetic field sensor and the second magnetic field sensor, and the second magnet can be situated before the second magnetic field sensor, in the direction of introduction of the probe into the hollow space. The allocation of a respective magnetic field sensor to each magnet makes it possible for magnetic remanences that result from the movement of the probe in the hollow space to be detected immediately by the corresponding magnetic field sensor. In this way, even inclusions having small diameters can be reliably detected.

In further advantageous realizations of the probe according to the present invention, the first and the second magnetic field sensor are what are known as GMR sensors (Giant MagnetoResistance sensors), or are what are known as AMR sensors (Anisotropic MagnetoResistance sensors). Such sensors have the advantage that they are normally small in their dimensions, and, in their embodiments as gradiometers, are relatively insensitive to magnetic background signals. It is therefore possible to measure extremely weak magnetic fields such as those that arise due to the magnetic remanence of the foreign material deposits and inclusions.

In another advantageous construction of the probe according to the present invention, the magnetic field sensor or sensors are connected to an evaluation unit. In this way, it is possible for example to graphically display the determined measurement values, so that, besides the number of detected foreign material deposits and inclusions, their number and position in the hollow space, or in the material surrounding the hollow space, can be determined and displayed precisely.

In a further advantageous construction of the probe according to the present invention, the non-ferromagnetic material is a nickel-based alloy or a titanium alloy. Ferromagnetic foreign material deposits and inclusions are made of hard metal, in particular tungsten carbide. The named non-ferromagnetic materials are used in particular for the manufacture of components of compressors and turbines of aircraft engines. The named ferromagnetic foreign material deposits and inclusions arise during the spalling of parts of a drilling tool during the manufacture of drilled holes in the named components of the aircraft engines.

A method according to the present invention for detecting foreign material deposits and inclusions in hollow spaces, the hollow spaces being formed in a non-ferromagnetic material and the foreign material deposits and/or inclusions being made of a ferromagnetic material, has the following steps:
a) introduction of a probe into the hollow space, the probe comprising at least one magnetic field sensor and at least one first and one second magnet, the magnets being configured before at least one magnetic field sensor, in the direction of introduction into the hollow space, and situated relative to one another such that their pole axes run non-parallel to one another; b) magnetization of the foreign material deposits and inclusions using the magnets; c) measurement by the magnetic field sensor of the signatures of the magnetic fields, which have resulted from the magnetization and are measurable as magnetic remanence after the magnets are further moved, of the foreign material deposits and inclusions; and d) evaluation of the measured magnetic field data and presentation of the number and position of the foreign material deposits and inclusions in the hollow space. Through the magnetization of the ferromagnetic foreign material particles and/or inclusions in various directions, it is possible to precisely determine the main orientation of the particle or of the inclusion. Thus, a reliable detection and location of ferromagnetic foreign material deposits and/or inclusions is ensured.

In an advantageous realization of the method according to the present invention, the probe has a first and a second magnetic field sensor, the first magnetic field sensor being fashioned for the detection of a magnetic remanence caused by the first magnet, and the second magnetic field sensor being fashioned for the detection of a magnetic remanence caused by the second magnet. The first magnet can be situated between the first magnetic field sensor and the second magnetic field sensor, and the second magnet can be situated in the hollow space before the second magnetic field sensor, in the direction of introduction of the probe. In addition, the pole axes of the first and second magnets can be situated perpendicular to one another. Such an arrangement ensures that even the smallest ferromagnetic foreign material deposits and inclusions can be reliably detected, because the magnetic field sensors measure the magnetic field produced by the magnetic remanence immediately after the magnetization of these particles and inclusions. In particular, it is also possible to determine precisely the sizes and locations of the particles and inclusions.

In another advantageous realization of the method according to the present invention, the probe is configured such that it can be introduced into a hollow space having a director between 2 mm and 100 mm, in particular between 2 mm and 10 mm. Through the miniaturization according to the present invention of the probe, it is possible to detect ferromagnetic foreign material deposits and inclusions even in bored holes having corresponding diameters. Here, the first and second magnetic field sensor can be what are known as GMR sensors or what are known as AMR sensors, which on the one hand can be fashioned with small dimensions, and on the other hand are relatively insensitive to possible magnetic disturbance or interference effects.

In another advantageous realization of the method according to the present invention, inside the hollow space the probe is moved along a straight line or is rotated. This makes it possible in one working step also to detect and display three-dimensional distribution patterns of ferromagnetic foreign material deposits and inclusions in the hollow spaces.

The probe according to the present invention described above or the method according to the present invention described above are used in the detection of foreign material deposits and inclusions in bored holes in components of aircraft engines, in particular in compressor and turbine components. The foreign material deposits and inclusions can be particles spalled from drilling tools, made of ferromagnetic materials. In this way, in this sensitive technical area it is possible to avoid damages caused for example by the hard metal inclusions, remaining in the bored hole, of the material spalled from the drilling tool. This relates on the one hand to damages that can occur during post-processing, for example using various frictional methods, as well as to later damage, such as for example the formation of cracks in the corresponding engine components.

In an advantageous realization, the probe is moved in linear fashion inside the hollow space.

The magnetic field sensor or sensors are preferably magnetic field gradiometers.

BRIEF DESCRIPTION OF DRAWINGS

Further advantages, features, and details of the present invention result from the following description of a graphically depicted exemplary embodiment.

DETAILED DESCRIPTION

Figure 1:
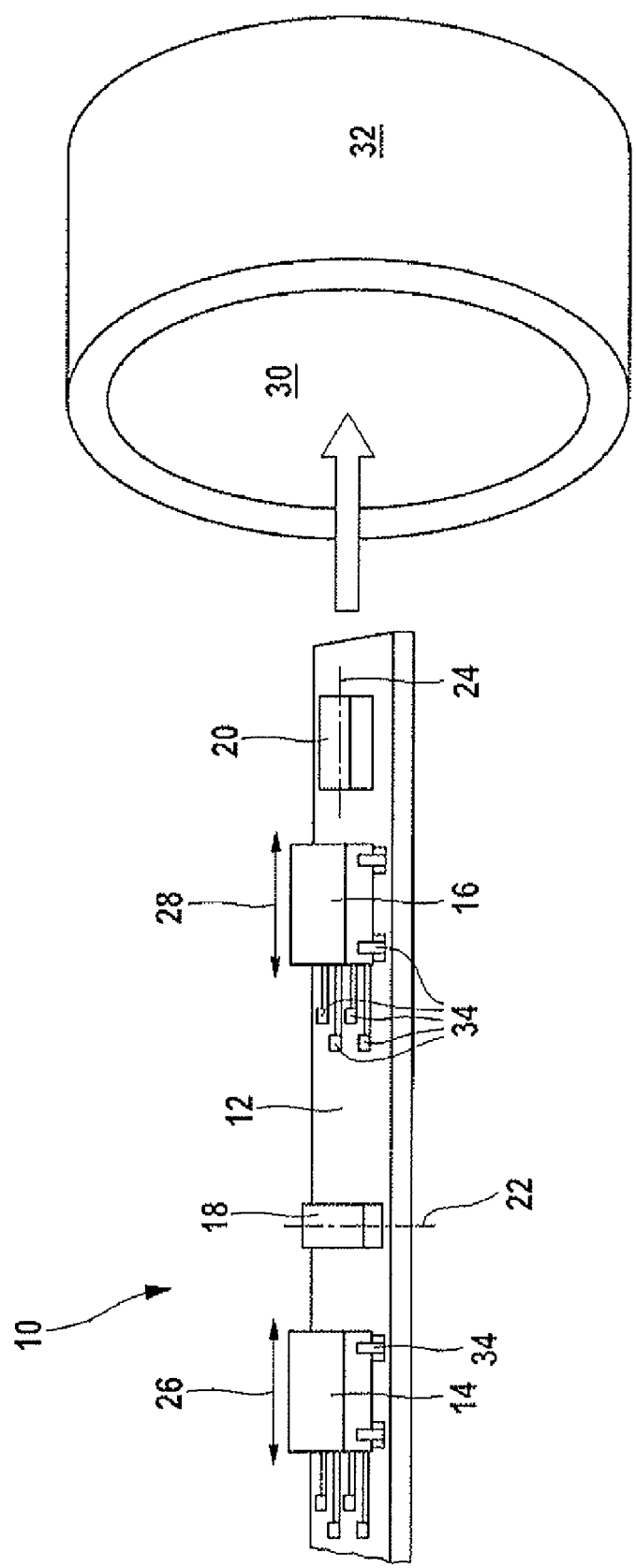
FIG. 1 shows a representation of a probe according to the present invention for a magnetic remanence measurement method.

FIG. 1 shows a probe 10 for use in a magnetic remanence measurement method. Probe 10 consists of an elongated base element 12 on which there are situated a first magnet 18 and a second magnet 20, as well as a first magnetic field sensor 14 and a second magnetic field sensor 16. In addition, various terminals 34 are formed on base element 12, such as for example terminals for the supply of power to magnetic field sensors 14, 16, terminals for the grounding of magnetic field sensors 14, 16, and also terminals for the data transmission of the values determined by magnetic field sensors 14, 16 to an evaluation unit (not shown). It can be seen that in the direction of introduction of sensor 10 into a hollow space 30 of a component 32 made of non-ferromagnetic material, second magnet 20 is situated before second magnetic field sensor 16, and second magnetic field sensor 16 is situated before first magnet 18, and first magnetic field sensor 14 is situated behind first magnet 18. Here, the distance between second magnet 20 and second magnetic field sensor 16 can be approximately 2 mm, the distance between first magnet 18 and first magnetic field sensor 14 can be approximately 3 mm, and the distance between magnetic field sensors 14, 16 can be approximately 15 mm. In the depicted exemplary embodiment, magnetic field sensors 14, 16 are approximately 1.3 mm high. Magnets 18, 20 have a height of approximately 1 mm. In addition, it can be seen that pole axes 22, 24 of first magnet 18 and of second magnet 20 run in different directions; in the depicted exemplary embodiment, they run perpendicular to one another. The pole axis 24 of second magnet 20 is situated perpendicular to sensitivity axes 26, 28 of magnetic field sensors 14, 16. Pole axis 22 of first magnet 18 is correspondingly oriented parallel to sensitivity axes 26, 28. Overall, probe 10 is dimensioned in such a way that it can be introduced into a hollow space 30 that has a diameter between 2 mm and 100 mm, in particular between 2 mm and 10 mm. Hollow space 30 shown in the exemplary embodiment has a diameter of approximately 7.2 mm. Base element 12 is made of a non-ferromagnetic material.

Magnetic field sensors 14, 16 used in the exemplary embodiment are what are known as GMR sensors (Giant MagnetoResistance sensors). These are capable of detecting very small flux densities or magnetic fields of magnetized ferromagnetic foreign material deposits and inclusions.

Figure 2:
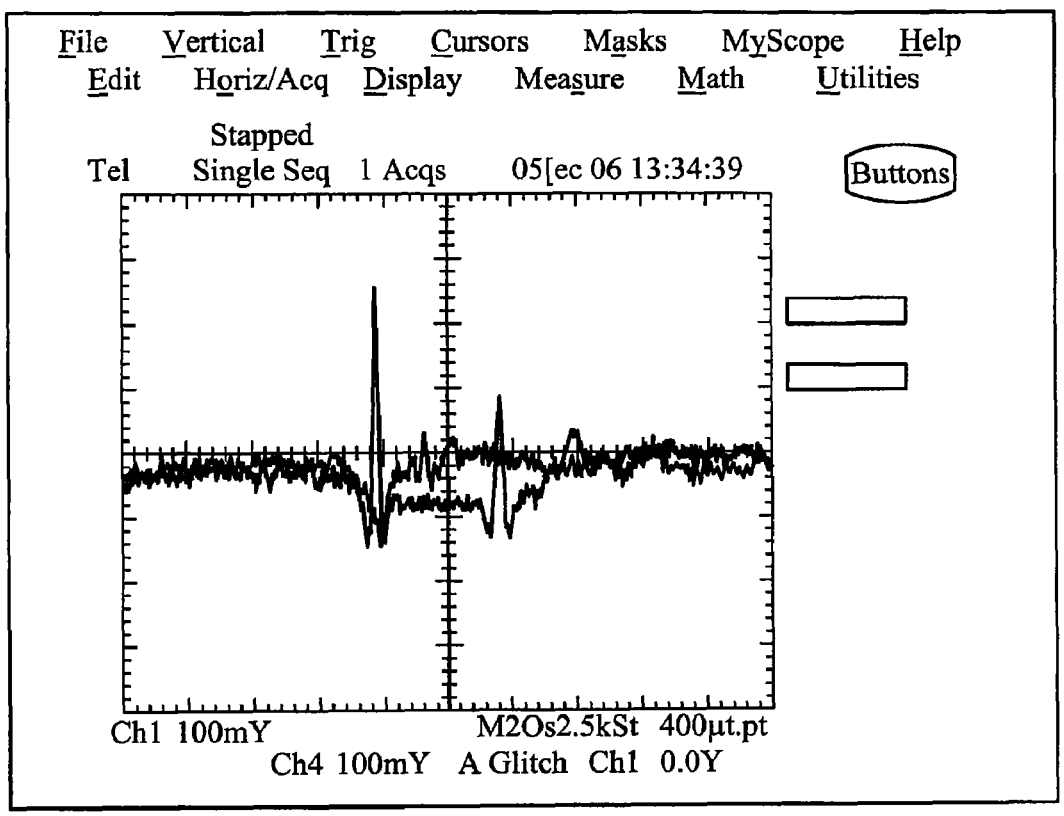
FIG. 2 shows a screen print of a measurement result of two GMR magnetic field sensors of the probe according to FIG. 1.

FIG. 2 shows a screen print of a measurement result of the two GMR magnetic field sensors 14, 16 of probe 10 constructed according to the exemplary embodiment shown in FIG. 1. This is a line scan of the two magnetic field sensors 14, 16. The Figure clearly shows the peaks of relatively high magnetic flux density in certain areas of the linear scan, each peak representing a ferromagnetic inclusion in hollow space 30. This is a bipolar representation, in which changes in the magnetic flux density are indicated in millivolts and are shown proportional to the measured magnetic flux density in teslas (cf. the centrically oriented vertical axis of the diagram). The depicted linear scan shows clearly that the arrangement of two magnets 18, 20 whose pole axes 22, 24 are oriented differently to one another, in particular perpendicular to one another, enables a very precise detection of foreign material deposits and inclusions in hollow spaces 30, with respect both to their number and to their size and positioning inside hollow space 30.

What is claimed:

1. A probe for detecting foreign material deposits and inclusions in hollow spaces, the hollow spaces being formed in a non-ferromagnetic material and the foreign material deposits and inclusions being made of a ferromagnetic material, the probe comprising:
at least one magnetic field sensor,
at least one first and one second magnet, the magnets being positioned before the at least one magnetic field sensor in a direction of introduction into the hollow space, and being situated relative to one another so that their pole axes are non-parallel.

2. The probe as recited in claim 1, wherein the magnetic field sensor and the magnets are situated on a base element.

3. The probe as recited in claim 1, wherein the probe has a first and a second magnetic field sensor, the first magnetic field sensor configured to detect a magnetic remanence caused by the first magnet, and the second magnetic field sensor configured to detect a magnetic remanence caused by the second magnet.

4. The probe as recited in claim 3, wherein the first magnet is situated between the first magnetic field sensor and the second magnetic field sensor, and the second magnet is situated before the second magnetic field sensor in the direction of introduction of the probe into the hollow space.

5. The probe as recited in claim 1, wherein the probe is dimensioned such that the pole axes of the first and second magnet are perpendicular to one another.

6. The probe as recited in claim 1, wherein said probe is configured to fit within hollow spaces having a diameter between 2 mm and 100 mm.

7. The probe as recited in claim 3, wherein the first and the second magnetic field sensors are one of GMR sensors (Giant MagnetoResistance sensors) and AMR sensors (Anisotropid MagnetoResistance sensors).

8. The probe as recited in claim 1, wherein the at least one magnetic field sensor is connected to an evaluation unit.

9. The probe as recited in claim 1, wherein the non-ferromagnetic material is one of a nickel-based alloy and a titanium alloy, and the ferromagnetic foreign material deposits and inclusions are made of tungsten carbide.

10. A method for detecting foreign material deposits and inclusions in hollow spaces, the hollow spaces being formed in a non-ferromagnetic material, and the foreign material deposits and inclusions being made of a ferromagnetic material, comprising:
a) introduction of a probe into the hollow space, the probe comprising at least one magnetic field sensor and at least one first and one second magnet, the magnets being configured before at least one magnetic field sensor in the direction of introduction into the hollow space, and being situated relative to one another such that their pole axes run non-parallel to one another;
b) magnetization of the foreign material deposits and inclusions by the magnets;
c) measurement by the magnetic field sensor of the signatures of the magnetic fields of the foreign material deposits and inclusions, said signatures resulting from the magnetization and being measurable as magnetic remanence after further movement of the magnets; and
d) evaluation of the measured magnetic field data and representation of the number and position of the foreign material deposits and inclusions in the hollow space.

11. The method as recited in claim 10, wherein the probe has a first and a second magnetic field sensor, the first magnetic field sensor being fashioned for the detection of a magnetic remanence caused by the first magnet, and the second magnetic field sensor being fashioned for the detection of a magnetic remanence caused by the second magnet.

12. The method as recited in claim 11, wherein the first magnet is situated between the first magnetic field sensor and the second magnetic field sensor, and the second magnet is situated before the second magnetic field sensor in the direction of introduction of the probe into the hollow space.

13. The method as recited in claim 10, wherein the pole axes of the first and second magnets are situated perpendicular to one another.

14. The method as recited in claim 10, wherein the probe is dimensioned such that it can be introduced into a hollow space having a diameter between 2 mm and 100 mm.

15. The method as recited in claim 10, wherein the first and the second magnetic field sensors are GMR sensors (Giant MagnetoResistance sensors) or AMR sensors (Anisotropic MagnetoResistance sensors).

16. The method as recited in claim 10, wherein the probe is rotated inside the hollow space.

17. The method as recited in claim 10, for the detection of foreign material deposits and inclusions in bored holes in components of aircraft engines.

18. The use of a probe as recited in claim 1, for the detection of foreign material deposits and inclusions in bored holes in components of aircraft engines.

19. The use of a probe as recited in claim 18, wherein the foreign material deposits and inclusions are spalled fragments from drilling tools, made of ferromagnetic materials.

* * * * *